US007102550B1

United States Patent
Watanabe et al.

(10) Patent No.: US 7,102,550 B1
(45) Date of Patent: Sep. 5, 2006

(54) SYSTEM AND METHOD FOR DECODING A VARIABLE-LENGTH CODEWORD WHILE UPDATING THE VARIABLE-LENGTH CODEWORD

(75) Inventors: Kiwamu Watanabe, Kanagawa (JP);
Shuji Michinaka, Kanagawa (JP);
Akihiro Oue, Kanagawa (JP);
Tatsuhiro Suzumura, Kanagawa (JP);
Satoshi Takekawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/166,174

(22) Filed: Jun. 27, 2005

(30) Foreign Application Priority Data

Mar. 11, 2005 (JP) ............................ P2005-069795

(51) Int. Cl.
*H03M 7/40* (2006.01)
(52) U.S. Cl. .......................................... 341/67; 341/51
(58) Field of Classification Search ............ 341/50–70,
341/106
See application file for complete search history.

(56) References Cited

U.S. PATENT DOCUMENTS 5,173,695 A * 12/1992 Sun et al. ...................... 341/67
5,245,338 A * 9/1993 Sun ................................ 341/67
5,717,394 A * 2/1998 Schwartz et al. ............. 341/51
6,414,608 B1 * 7/2002 Nishida et al. ................ 341/67
6,433,709 B1 * 8/2002 Oue ............................... 341/67
6,975,253 B1 * 12/2005 Dominic ........................ 341/67
2005/0174270 A1 * 8/2005 Koo et al. ..................... 341/67

FOREIGN PATENT DOCUMENTS

JP        05-235781        9/1993

* cited by examiner

*Primary Examiner*—Lam T. Mai
(74) *Attorney, Agent, or Firm*—Oblon, Spivak, McClelland, Maier & Neustadt, P.C.

(57) ABSTRACT

A system for decoding a variable-length codeword includes a buffer circuit storing the codeword, a detection circuit detecting the number of bits of a prefix portion of the codeword by use of a detection table while updating the codeword, an extraction circuit extracting a codeword of a suffix portion of the codeword based on the number of bits of the prefix portion while updating the codeword, and a first decoding circuit decoding the codeword base on the number of bits of the prefix portion and the codeword of the suffix portion.

20 Claims, 6 Drawing Sheets

FIG. 2

| BIT STRING | DECODING RESULT |
|---|---|
| 1 | 0 |
| 010 | 1 |
| 011 | 2 |
| 00100 | 3 |
| 00101 | 4 |
| 00110 | 5 |
| 00111 | 6 |
| 0001000 | 7 |
| 0001001 | 8 |
| 0001010 | 9 |
| ⋮ | ⋮ |
| 000000010000000 | 127 |
| | ⋮ |

FIG. 3

| BIT STRING | NUMBER OF BITS |
|---|---|
| 1 | 0 |
| 01x | 1 |
| 001xx | 2 |
| 0001xxx | 3 |
| 00001xxxx | 4 |
| 000001xxxxx | 5 |
| ⋮ | ⋮ |
| 0000000000000001 | 15 |
| 0000000000000000 | 16 |

| BIT STRING | DECODING RESULT |
|---|---|
| 1 | 0 |
| 010 | 1 |
| 011 | 2 |
| 00100 | 3 |
| 00101 | 4 |
| 00110 | 5 |
| 00111 | 6 |
| 0001000 | 7 |
| 0001001 | 8 |
| 0001010 | 9 |
| ⋮ | ⋮ |
| 000000011111111 | 254 |

FIG. 7

| BIT STRING | CODE LENGTH |
|---|---|
| 1 | 1 |
| 01x | 3 |
| 001xx | 5 |
| 0001xxx | 7 |
| 00001xxxx | 9 |
| 000001xxxxx | 11 |
| ⋮ | ⋮ |
| 00000001xxxxxxx | 15 |

| BIT STRING | DECODING RESULT |
|---|---|
| 11 | 0 |
| 1010 | 1 |
| 1011 | 2 |
| 100100 | 3 |
| 100101 | 4 |
| 100110 | 5 |
| 100111 | 6 |
| 10001000 | 7 |
| ⋮ | ⋮ |
| 01x1 | 0 |
| 01x010 | 1 |
| 01x011 | 2 |
| 01x00100 | 3 |
| 01x00101 | 4 |
| 01x00110 | 5 |
| 01x00111 | 6 |
| 01x0001000 | 7 |
| ⋮ | ⋮ |
| 00000001111111111 | 1 |

| BIT STRING | CODE LENGTH |
|---|---|
| 11 | 1 |
| 101x | 3 |
| 1001xx | 5 |
| 10001xxx | 7 |
| ⋮ | ⋮ |
| 01x1 | 1 |
| 01x01x | 3 |
| 01x001xx | 5 |
| 01x0001xxx | 7 |
| ⋮ | ⋮ |
| 00000001xxxxxxx1 | 1 |

SYSTEM AND METHOD FOR DECODING A VARIABLE-LENGTH CODEWORD WHILE UPDATING THE VARIABLE-LENGTH CODEWORD

CROSS REFERENCE TO RELATED APPLICATIONS AND INCORPORATION BY REFERENCE

This application is based upon and claims the benefit of priority from prior Japanese Patent Application P2005-069795 filed on Mar. 11, 2005; the entire contents of which are incorporated by reference herein.

BACKGROUND OF THE INVENTION

1. Field of the Invention

The present invention relates to a system for decoding a variable-length codeword and a method for the same.

2. Description of the Related Art

In data transmission, a variable-length codeword having a prefix portion and a suffix portion is used. The code length of the suffix portion is determined by the number of bits of the prefix portion. For example, with regard to an exp-golomb codeword, the decoding result is determined by the number of zeros in the prefix portion and the codeword of the suffix portion.

In the related art, a variable-length codeword is decoded by use of a general-purpose processor having a zero detection command. The processor executes the following steps:

(1) The number of zeros located in a line from the top of the variable-length codeword stored in a buffer circuit is counted by the zero detection command.

(2) The location of the first bit of the suffix portion of the variable-length codeword stored in the buffer circuit is calculated on the basis of the number of zeros.

(3) The suffix portion is stored in the buffer circuit.

(4) The decoding result is obtained from the number of zeros in the prefix portion and the codeword of the suffix portion.

Each of the steps listed above requires an execution time corresponding to at least one cycle of the processor. Moreover, also in the case of a short codeword within the capacity of the buffer circuit, the codeword is decoded using the above steps. Accordingly, in the case of the short codeword, a period of approximately 5 to 10 cycles is required to decode the exp-golomb codeword.

There is a method for decoding a variable-length codeword in which the codeword is divided into halves having a half-length of the maximum code length when the number of bits of the variable-length codeword is larger than the number of bits which can be stored in the buffer circuit. However, in this method, a buffer circuit which can store the codeword having a half-length of the maximum code length is required.

SUMMARY OF THE INVENTION

An aspect of the present invention inheres in a system for decoding a variable-length codeword. The system includes a buffer circuit configured to store at least a part of the variable-length codeword; a detection circuit configured to detect the number of bits of a prefix portion of the variable-length codeword by use of a detection table while updating the variable-length codeword; an extraction circuit configured to extract a codeword of a suffix portion of the variable-length codeword based on the number of bits of the prefix portion while updating the variable-length codeword; and a first decoding circuit configured to decode the variable-length codeword based on the number of bits of the prefix portion and the codeword of the suffix portion.

Another aspect of the present invention inheres in a computer implemented method for decoding a variable-length codeword. The method includes storing at least a part of the variable-length codeword in a buffer circuit; detecting the number of bits of a prefix portion of the variable-length codeword by use of a detection table while updating the variable-length codeword; extracting a codeword of a suffix portion of the variable-length codeword based on the number of bits of the prefix portion while updating the variable-length codeword; and decoding the variable-length codeword based on the number of bits of the prefix portion and the codeword of the suffix portion.

BRIEF DESCRIPTION OF DRAWINGS

FIG. 2 is a table showing an example of a decoding result by the system for decoding a variable-length codeword according to the first embodiment of the present invention.

FIG. 3 is an example of a detection table used in the decoding system according to the first embodiment of the present invention.

FIGS. 4A to 4E show examples of states of the bit strings stored in a buffer circuit of the system for decoding a variable-length codeword according to the first embodiment of the present invention.

FIG. 6 is an example of a first decoding table used in the system for decoding a variable-length codeword according to the second embodiment of the present invention.

FIG. 7 is an example of a first codeword length table used in the system for decoding a variable-length codeword according to the second embodiment of the present invention.

DETAILED DESCRIPTION OF THE INVENTION

Figure 1:
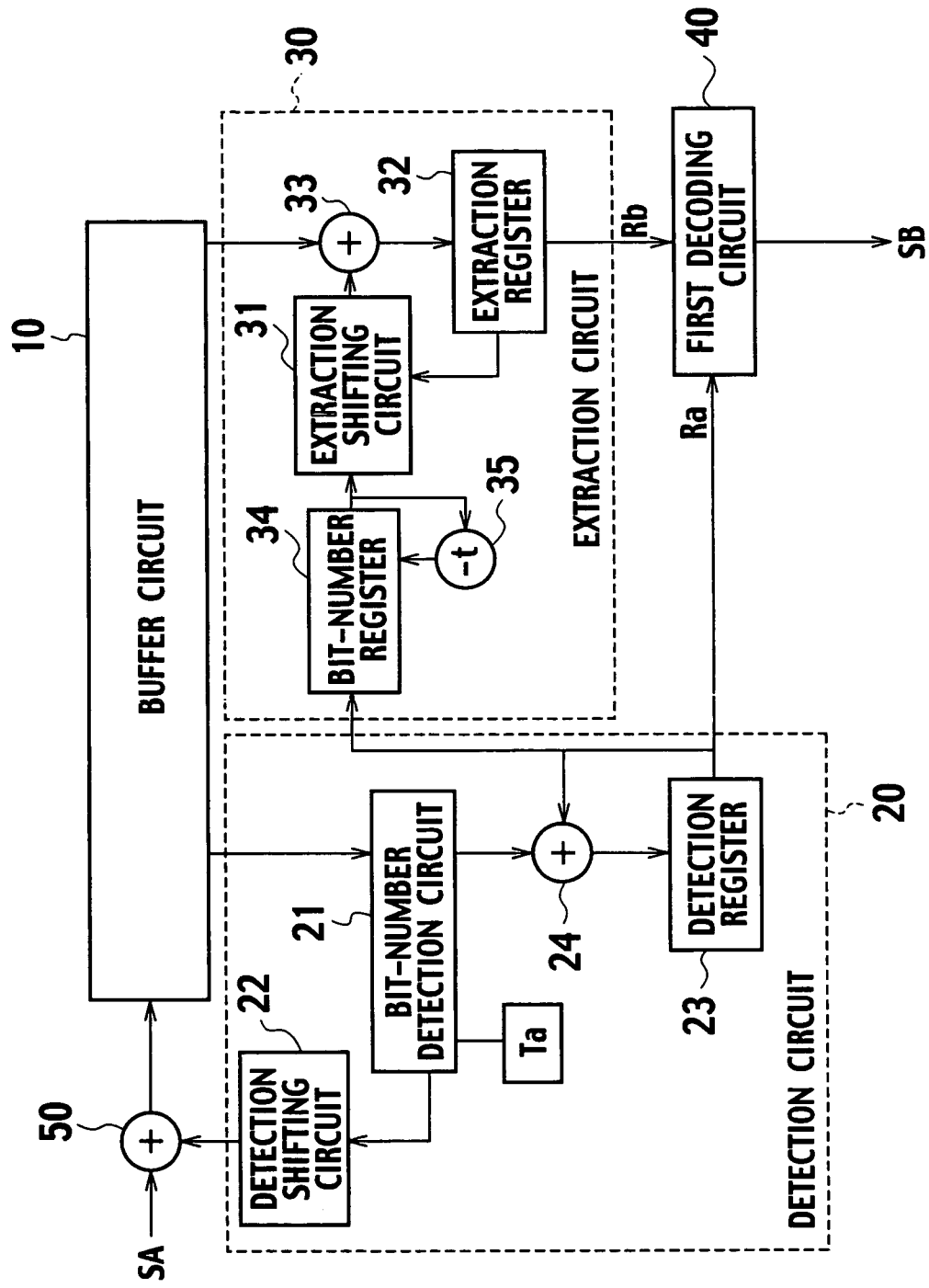
FIG. 1 is a schematic diagram showing a configuration of a system for decoding a variable-length codeword according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

As shown in FIG. 1, a system for decoding a variable-length codeword according to a first embodiment of the present invention includes a buffer circuit 10, a detection circuit 20, an extraction circuit 30 and a first decoding circuit 40. The buffer circuit 10 stores at least a part of a variable-length codeword. The detection circuit 20 detects the number of bits of the prefix portion of the variable-length codeword by use of a detection table Ta while updating the variable-length codeword. The extraction circuit 30 extracts the codeword of the suffix portion of the variable-length codeword on the basis of the number of bits of the prefix portion while updating the variable-length codeword. The first decoding circuit 40 decodes the variable-length codeword on the basis of the number of bits of the prefix portion and the codeword of the suffix portion. Herein, "updating the variable-length codeword" means storing, in the buffer circuit 10, the remaining portion of the variable-length codeword, a part of which was stored in the buffer circuit 10. As a result, the variable-length codeword stored in the buffer circuit 10 is updated. The detection table Ta is a table for looking up the number of bits of the variable-length codeword stored in the buffer circuit 10.

The variable-length codeword decoded by the system shown in FIG. 1 is an exp-golomb codeword, for example. As described above, in the exp-golomb codeword, a decoding result is determined by the number of zeros in the prefix portion and the codeword of the suffix portion. A description will be given below of a case where the variable-length codeword is an exp-golomb codeword, as an example. A variable-length codeword (hereinafter referred to as "the codeword") SA is fed to the decoding system shown in FIG. 1. If the number of bits of the codeword SA is larger than the number of bits B1 which can be stored in the buffer circuit 10, the first B1-bit part of the codeword SA is stored in the buffer circuit 10. As shown in FIG. 1, a decoding result SB of the codeword SA is transmitted as an output from the first decoding circuit 40.

An example of the codeword SA is shown in FIG. 2. The exp-golomb codeword has a prefix portion and a suffix portion, the code length of which is determined by the number of zeros in the prefix portion. For example, when the codeword SA is the bit string "00110", the first bit string "00" is the prefix portion. The next bit "1" is the bit (hereinafter referred to as "the boundary bit") indicating the boundary between the prefix portion and the suffix portion. Since there are two zeros included in the prefix portion, the code length of the suffix portion is two. That is, the bit string "10" following the boundary bit "1" is the suffix portion.

On the basis of the number of bits Ra of the prefix portion and the codeword Rb of the suffix portion of the exp-golomb codeword, the decoding result SB is obtained by use of an expression (1):

$$SB = ([1<<Ra]-1) + Rb \quad (1)$$

In the expression (1), [1<<Ra] represents a bit string having the number of bits Ra of "0"s after "1". For example, if the codeword SA is the bit string "00110", the number of bits Ra is two, and the codeword Rb is the bit string "10". Accordingly, [1<<Ra] is the bit string "100". The decoding result SB is the bit string "101", which is obtained as follows: "1" is subtracted from the bit string "100" to obtain the bit string "011"; the bit string "10", which is the codeword Rb of the suffix portion, is added to the bit string "011" to obtain the bit string "101". That is, SB=5. The decoding results similarly obtained from various codewords by use of the expression (1) are shown in FIG. 2.

The detection circuit 20 includes a bit-number detection circuit 21, a detection shifting circuit 22, a detection register 23, and an adder 24. The buffer circuit 10, the detection shifting circuit 22, and the adder 24 are connected to the bit-number detection circuit 21. The bit-number detection circuit 21 detects the number of zeros in a line from the top of the codeword SA stored in the buffer circuit 10 with reference to the detection table Ta. The detection register 23 stores the number of bits Ra of the prefix portion of the codeword SA. The bit-number detection circuit 21 and an adder 50 are connected to the detection shifting circuit 22. The detection shifting circuit 22 updates the buffer circuit 10 by the number of zeros detected by the bit-number detection circuit 21.

The detection table Ta is a table for looking up the number of zeros in a line from the top of a codeword, as shown in FIG. 3, for example. In the bit strings of FIG. 3, "x" is an arbitrary bit, that is, "0" or "1". For example, when the codeword "0001xxx" is stored in the buffer circuit 10, the number of zeros in a line from the top of the codeword is three. In other words, the number of bits Ra of the prefix portion of the codeword "0001xxx" is three.

If the number of bits Ra of the prefix portion of the codeword SA is larger than the number of bits B1 which can be stored in the buffer circuit 10, only "0" is stored in the buffer circuit 10. In this case, the bit-number detection circuit 21 transmits the number of bits B1 to the detection shifting circuit 22. Then, the detection shifting circuit 22 update uses the adder 50 to the codeword SA, stored in the buffer circuit 10, by the number of bits B1. That is, the following bits of the prefix portion of the codeword SA are stored in the buffer circuit 10. In addition, the number of bits B1 is stored in the detection register 23. If the codeword newly stored in the buffer circuit 10 includes "0"s only, the above steps are repeated. That is, until the boundary bit "1" of the codeword SA is detected, the buffer circuit 10 is updated by the number of bits B1. Then, the number of bits B1 is added to the detection register 23. When the boundary bit "1" of the codeword SA is detected, the bit-number detection circuit 21 detects the number of zeros in a line from the top of the codeword stored in the buffer circuit 10 by use of the detection table Ta. The detected number of zeros is added to the detection register 23.

As described above, the number of 0 in the prefix portion of the codeword SA detected by the bit-number detection circuit 21 is added to the detection register 23 by the adder 24. Therefore, even if the number of bits Ra of the prefix portion of the codeword SA is larger than the number of bits B1 which can be stored in the buffer circuit 10, the number of bits Ra is stored in the detection register 23.

The extraction circuit 30 shown in FIG. 1 includes an extraction shifting circuit 31, an extraction register 32, an adder 33, a bit-number register 34 and a subtracter 35. The extraction register 32, the adder 33 and the bit-number register 34 are connected to the extraction shifting circuit 31. The buffer circuit 10 and the extraction register 32 are connected to the adder 33. The subtracter 35 and the detection register 23 are connected to the bit-number register 34.

The extraction circuit 30 extracts the codeword Rb of the suffix portion of the codeword SA from the buffer circuit 10. The extracted codeword Rb is stored in the extraction register 32. As described above, the code length of the codeword Rb of the suffix portion is the number of bits Ra of the prefix portion. Therefore, the extraction circuit 30 extracts the codeword Rb of the suffix portion as the bit string of the bit length of Ra. If the number of bits of the codeword Rb is larger than the number of bits B1, the entire codeword Rb cannot be stored in the buffer circuit 10. In this case, the extraction circuit 31 updates the buffer circuit 10 and sequentially extracts the codeword Rb. Then, the extraction circuit 30 stores the codeword Rb of the suffix portion in the extraction register 32. The bit-number register 34 stores the number of bits Ra.

The detection register 23 and the extraction register 32 are connected to the first decoding circuit 40. The first decoding circuit 40 obtains the decoding result SB by use of the expression (1) on the basis of the number of bits Ra of the prefix portion received from the detection resistor 23, and the codeword Rb of the suffix portion received from the extraction register 32.

A description will be given below of a method for decoding a variable-length codeword by use of the decoding system shown in FIG. 1. The codeword SA is fed to the decoding system shown in FIG. 1, and stored in the buffer circuit 10. For example, if the number of bits B1 which can be stored in the buffer circuit 10 is 8 bits, and the codeword SA is the nineteen-bit string "0000000001010010110", as shown in FIG. 4A, the bit string "00000000", which is the first eight bits of the codeword SA, is stored in the buffer circuit 10. Accordingly, "eight" is stored in the detection register 23. Then, the detection shifting circuit 22 updates the buffer circuit 10 by eight bits, and, as shown in FIG. 4B, the bit string "01010010" is stored in the buffer circuit 10. Accordingly, the bit-number detection circuit 21 detects that the number of zeros in a line from the top of the bit string "01010010", stored in the buffer circuit 10, is one with reference to the detection table Ta. The detected number of zeros is added to the detection register 23. As a result, the bit number Ra=9 of the prefix portion of the codeword SA is stored in the detection register 23. In addition, the number of bits Ra is transferred from the detection register 23 to the bit-number register 34, and the bit number Ra=9 is stored in the bit-number register 34.

On the basis of the number of zeros detected from the bit string "01010010", the detection shifting circuit 22 updates the buffer circuit 10 by one bit. Accordingly, as shown in FIG. 4C, the bit string "10100101" is stored in the buffer circuit 10. In addition, the detection shifting circuit 22 updates the buffer circuit 10 by one bit in order to eliminate the boundary bit "1" from the buffer circuit 10. As a result, as shown in FIG. 4D, the bit string "01001011" is stored in the buffer circuit 10. In other words, the first eight bits of the bit string "010010110", which is the codeword Rb, are stored in the buffer circuit 10 from the first bit thereof.

After the number of bits Ra are detected, the extraction circuit 30 acquires the codeword Rb of the suffix portion of the codeword SA from the buffer circuit 10 with reference to the number of bits Ra stored in the bit-number register 34. As is shown in the above example, if the number of bits of the codeword Rb is larger than the number of bits B1, the entire codeword Rb cannot be stored in the buffer circuit 10. In this case, the extraction circuit 31 updates the buffer circuit 10 and acquires the codeword Rb.

A description will be given by use of the above-described example. The extraction circuit 30 acquires the bit string "01001011", that is, "75", stored in the buffer circuit 10 with reference to the number of bits Ra stored in the bit-number register 34. Next, the extraction shifting circuit 31 updates the buffer circuit 10 by the number of bits of the acquired bit string, that is, by eight bits. As a result, as shown in FIG. 4E, the bit string "0xxxxxxx" is stored in the buffer circuit 10. Here, "x" is a bit of a codeword stored in the buffer circuit 10 next to the codeword SA. In addition, the eight bits, by which the extraction shifting circuit 31 updates the buffer circuit 10, is subtracted from the bit-number register 34 by the subtracter 35. As a result, one is stored in the bit-number register 34.

Next, the extraction circuit 30 acquires "0", which is the first one bit of the bit string "0xxxxxxx" stored in the buffer circuit 10 with reference to the one bit stored in the bit-number register 34. Then, "0" acquired by the extraction circuit 30 and the value obtained by updating the previously acquired "75" by one bit are added by the adder 33, and the addition result is stored in the extraction register 32. As a result, the codeword Rb=150 of the suffix portion of the codeword SA is stored in the extraction register 32.

Next, the first decoding circuit 40 decodes the codeword SA by use of the expression (1) on the basis of the number of bits Ra of the prefix portion and the codeword Rb of the suffix portion, and transmits the decoding result SB. In the above-described example, the decoding result SB=661. Thereafter, the detection shifting circuit 22 updates the buffer circuit 10 on the basis of the number of bits Ra, and stores the next codeword to be decoded in the buffer circuit 10 from the first bit thereof.

As described above, the system for decoding a variable-length codeword according to the first embodiment of the present invention detects the number of bits Ra of the prefix portion of the received codeword SA while updating the buffer circuit 10. In addition, the system extracts the codeword Rb of the suffix portion while updating the buffer circuit 10. Accordingly, even if the number of bits of the codeword SA is larger than the number of bits B1 which can be stored in the buffer circuit 10, it is possible to perform decoding. In addition, the system detects the number of bits Ra of the prefix portion of the codeword SA by comparing the codeword stored in the buffer circuit 10 and the detection table Ta. Accordingly, it is possible to reduce the number of cycles required to decode the codeword SA, as compared to the case where the number of bits Ra are detected by use of a zero detection command of a general purpose processor.

Second Embodiment

Figure 5:
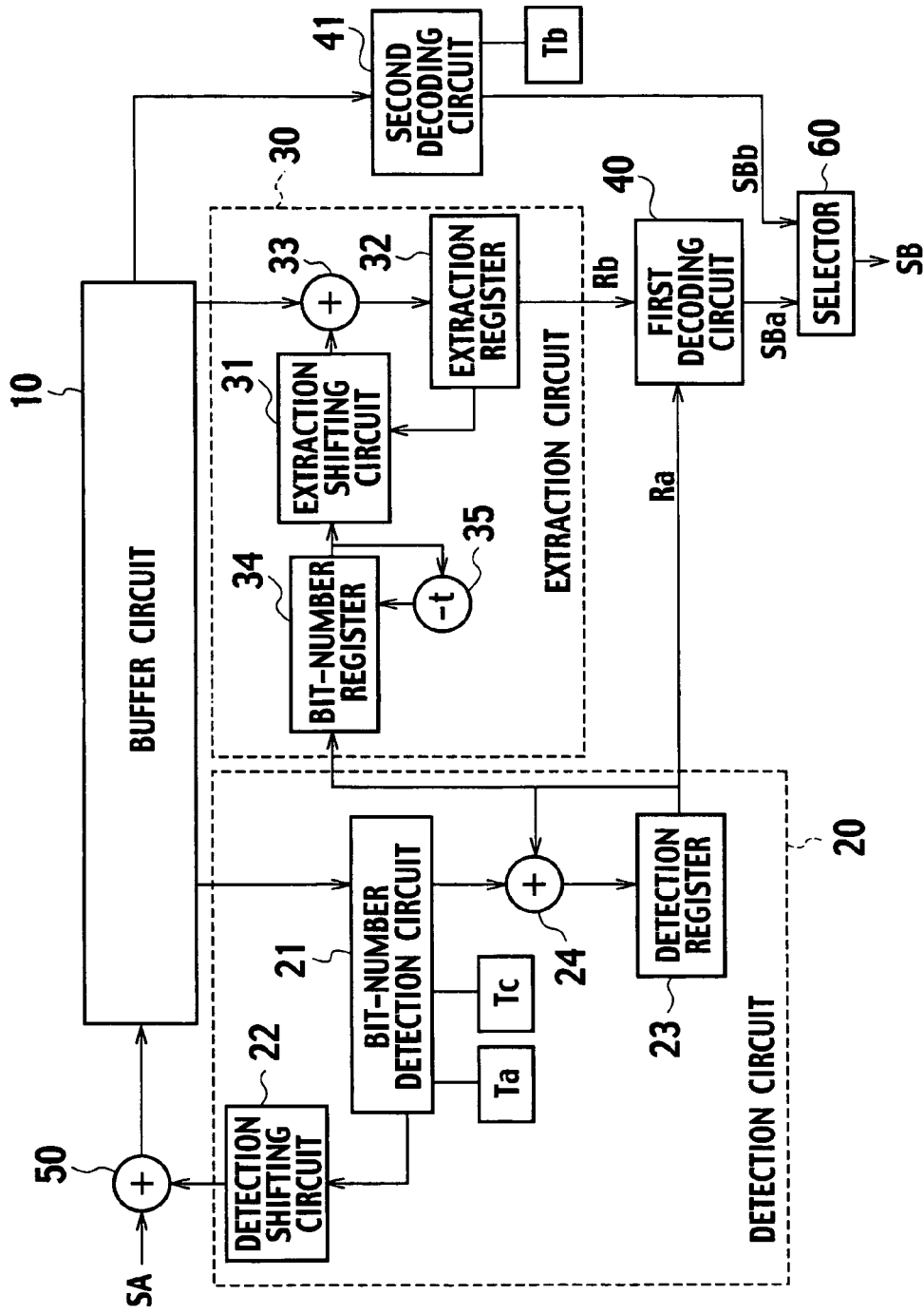
FIG. 5 is a schematic diagram showing a configuration of a system for decoding a variable-length codeword according to a second embodiment of the present invention.

As shown in FIG. 5, a system for decoding a variable-length codeword according to a second embodiment of the present invention is different from the system of FIG. 1 in that the system of this embodiment further includes a second decoding circuit 41, a selector 60, a decoding table Tb and a codeword length table Tc. Otherwise, the configuration is similar to that of the first embodiment shown in FIG. 1. When an entire codeword SA is stored in a buffer circuit 10, that is, when the number of bits of the codeword SA is smaller than the number of bits B1 which can be stored in the buffer circuit 10, the second decoding circuit 41 decodes the codeword SA by use of the decoding table Tb. The selector 60 transmits one of the decoding result SBa determined by a first decoding circuit 40 and the decoding result SBb determined by the second decoding circuit 41 as the decoding result SB of the codeword SA.

The decoding table Tb is a table for looking up the decoding result of the codeword stored in the buffer circuit 10 as shown in FIG. 6, for example. The second decoding circuit 41 compares the codeword stored in the buffer circuit 10 and the bit strings in the decoding table Tb. If there is a bit string matching the codeword stored in the buffer circuit 10 among the bit strings in the decoding table Tb, the second decoding circuit 41 acquires, from the decoding table Tb, the decoding result corresponding to the bit string which matches the codeword. If there is no bit string matching the codeword in the decoding table Tb, the decoding table Tb returns "0" as the decoding result. If the number of bits of the codeword to be decoded is larger than the number of bits B1 which can be stored in the buffer circuit 10, there is no bit string matching the codeword in the decoding table Tb, and the decoding table Tb therefore returns "0" as the decoding result.

With reference to the decoding system shown in FIG. 5, a description will be given of a method for decoding a variable-length codeword. A codeword SA to be decoded is fed to the decoding system shown in FIG. 5, and is stored in the buffer circuit 10. If there is a bit string matching the codeword SA stored in the buffer circuit 10 among the bit strings in the decoding table Tb, the second decoding circuit 41 acquires the corresponding decoding result SBb from the decoding table Tb. For example, when the codeword "00010101" is stored in the buffer circuit 10, the second decoding circuit 41 acquires the decoding result "9". The acquired decoding result SBb is transmitted from the second decoding circuit 41 to the selector 60.

A bit-number detection circuit 21 detects the code length of the codeword stored in the buffer circuit 10 with reference to the codeword length table Tc. The codeword length table Tc is a table for looking up the code length of the codeword stored in the buffer circuit 10 as shown in FIG. 7, for example. In the bit strings shown in FIG. 7, "x" is an arbitrary bit, that is, "0" or "1". For example, the bit string "00010101" stored in the buffer circuit 10 matches the bit string "0001xxx" in the codeword length table Tc. Accordingly, the code length of the codeword stored in the buffer circuit 10 is seven bits. A detection shifting circuit 22 updates the buffer circuit 10 by seven bits, and stores the next codeword to be decoded in the buffer circuit 10 from the first bit thereof.

On the other hand, if there is no bit string matching the codeword stored in the buffer circuit 10 among the bit strings in the decoding table Tb, the codeword is decoded by the method described in the first embodiment. Specifically, a detection circuit 20 detects the number of bits Ra of the prefix portion of the codeword SA. Next, an extraction circuit 30 extracts the codeword Rb of the suffix portion. Then, the first decoding circuit 40 acquires the decoding result SBa by use of the expression (1) on the basis of the number of bits Ra of the prefix portion and the codeword Rb of the suffix portion. The acquired decoding result SBa is transmitted to the selector 60.

One of the decoding result SBa and the decoding result SBb is transmitted to the selector 60. The selector 60 transmits one of the decoding result SBa and the decoding result SBb as the decoding result SB of the codeword SA.

In the system for decoding a variable-length codeword according to the second embodiment of the present invention, the decoding table Tb for looking up the decoding result of the codeword stored in the buffer circuit 10 is used. Accordingly, if the number of bits of the codeword SA is smaller than the number of bits B1 which can be stored in the buffer circuit 10, it is possible to decode the codeword SA in one cycle. In the decoding system shown in FIG. 1, since each of detection of the number of bits Ra of the prefix portion and the extraction of the codeword Rb of the suffix portion requires at least one cycle, at least two cycles are required to decode the codeword SA. In other words, with the system for decoding a variable-length codeword according to the second embodiment, it is possible to reduce the number of cycles required to decode the codeword SA. Otherwise, the second embodiment is substantially similar to the first embodiment, and a redundant description is omitted.

Third Embodiment

Figure 8:
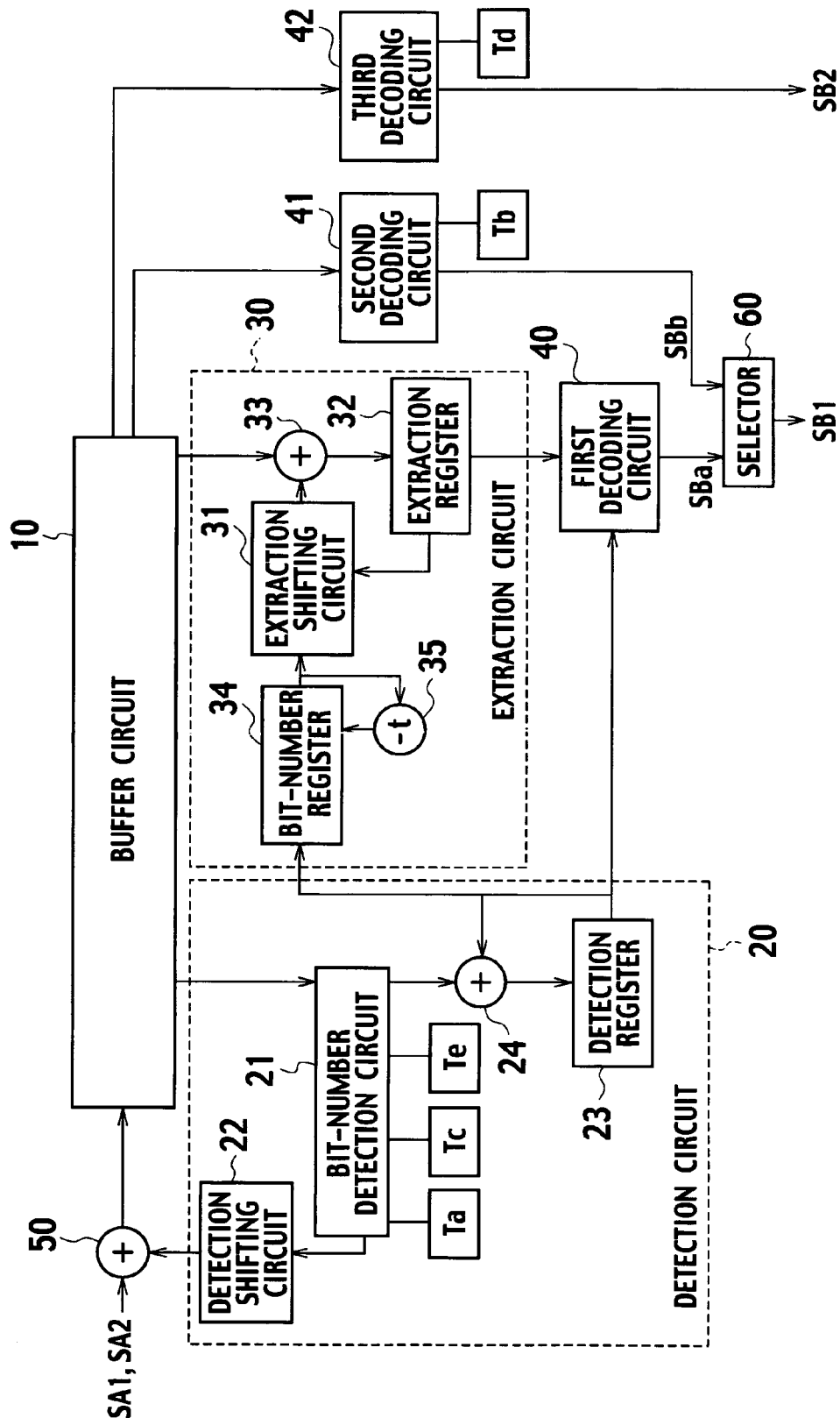
FIG. 8 is a schematic diagram showing a configuration of a system for decoding a variable-length codeword according to a third embodiment of the present invention.

As shown in FIG. 8, a decoding system according to a third embodiment of the present invention is different from the system of FIG. 5 in that the system of this embodiment further includes a third decoding circuit 42, a second codeword decoding table Td and a second codeword length table Te. Otherwise, the configuration is similar to that of the second embodiment shown in FIG. 5. When a plurality of codewords are stored in a buffer circuit 10, the third decoding circuit 42 decodes the second codeword stored in the buffer circuit 10 by use of the second codeword decoding table Td.

Figures 9, 10, 11:
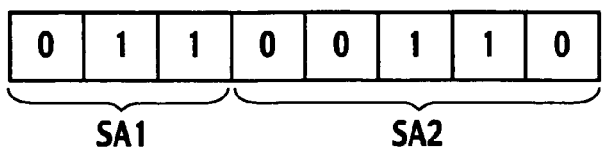
FIG. 9 is an example of a second decoding table used in the system for decoding a variable-length codeword according to the third embodiment of the present invention.
FIG. 10 is an example of a second codeword length table used in the system for decoding a variable-length codeword according to the third embodiment of the present invention.
FIG. 11 is a table showing an example of the variable-length codeword to be decoded by the system for decoding a variable-length codeword according to the third embodiment of the present invention.

The second codeword decoding table Td is a table for looking up the decoding result of the second codeword stored in the buffer circuit 10, as shown in FIG. 9, for example. In the bit strings shown in FIG. 9, "x" is an arbitrary bit, that is, "0" or "1". The third decoding circuit 42 compares the bit string stored in the buffer circuit 10 and the bit strings in the second codeword decoding table Td. If there is a bit string matching the bit string stored in the buffer circuit 10 among the bit strings in the second codeword decoding table Td, the third decoding circuit 42 acquires, from the second codeword decoding table Td, the decoding result corresponding to the bit string which matches the bit string stored in the buffer circuit 10.

A bit-number detection circuit 21 detects the code length of the second codeword stored in the buffer circuit 10, with reference to the second codeword length table Te. The second codeword length table Te is a table for looking up the code length of the second codeword stored in the buffer circuit 10, as shown in FIG. 10, for example. In the bit strings shown in FIG. 10, "x" is an arbitrary bit, that is, "0" or "1". If there is no second codeword stored in the buffer circuit 10 in the second codeword length table Te, the second codeword length table Te returns "0" as the code length of the codeword.

With reference to the decoding system shown in FIG. 8, a description will be given of a method for decoding a variable-length codeword. Hereinafter, a description will be given of the case where a codeword SA1 of the bit string "011" and a codeword SA2 of the bit string "00110" are stored in the buffer circuit 10, as shown in FIG. 11. Specifically, this is the case where neither the code length of the codeword SA1 detected by use of a codeword length table Tc nor the code length of the codeword SA2 detected by use of the second codeword length table Te is zero.

The codewords SA1 and SA2 to be decoded are fed to the decoding system shown in FIG. 8, and the bit string "01100110" is stored in the buffer circuit 10 as shown in FIG. 11. A detection circuit 20 detects three bits of the code length of the first codeword SA1 stored in the buffer circuit 10, with reference to the codeword length table Tc shown in FIG. 7. In addition, the detection circuit 20 detects the code length of the second codeword SA2 stored in the buffer circuit 10, with reference to the second codeword length table Te shown in FIG. 10. The bit string "01100110" matches the bit string "01x001xx" in the second codeword length table Te shown in FIG. 10. Accordingly, the detection circuit 20 detects five bits as the code length of the codeword SA2 stored in the buffer circuit 10 the second.

If the code length of the codeword SA2 detected by use of the second codeword length table Te is not zero, the third decoding circuit 42 acquires the decoding result of the second codeword SA2 stored in the buffer circuit 10, with reference to the second codeword decoding table Td shown in FIG. 9. The bit string stored in the buffer circuit 10 matches the bit string "01x00110" in the second codeword decoding table Td shown in FIG. 9. Accordingly, the third decoding circuit 42 acquires "5" as the decoding result SB2 of the codeword SA2 of the bit string "00110". Then, the third decoding circuit 42 transmits the decoding result SB2. By using the second codeword decoding table Td, the third decoding circuit 42 can decode the codeword SA2 in one cycle.

As in the method described in the second embodiment, a second decoding circuit 41 decodes the codeword SA stored in the buffer circuit 10 by use of the decoding table Tb. Specifically, the second decoding circuit 41 acquires the detection result "2" corresponding to the bit string "011" which matches the codeword SA1 by use of the decoding table Tb shown in FIG. 6. Then the second decoding circuit 41 transmits the acquired decoding result "2" as the decoding result SB of the codeword SA1. By using the decoding table Tb, the second decoding circuit 41 can decode the codeword SA1 in one cycle.

The second and third decoding circuits 41 and 42 can operate simultaneously. That is, decoding the codeword SA1 and the codeword SA2 can be performed in the same cycle.

Thereafter, the detection circuit 20 updates the bit string stored in the buffer circuit 10 by a total of eight bits, which results from three bits of the code length of the codeword SA1, and five bits of the code length of the codeword SA2. As a result, the next codeword to be decoded is stored in the buffer circuit 10 from the first bit thereof.

On the other hand, if the code length of the codeword SA2 detected by use of the second codeword length table Te is zero, and the code length of the codeword SA1 detected by use of the codeword length table Tc is not zero, one codeword SA1 is stored in the buffer circuit 10. In this case, as in the method described in the second embodiment, the second decoding circuit 41 decodes the codeword SA1 by use of the decoding table Tb. The decoding system shown in FIG. 8 transmits the decoding result SB1 of the codeword SA1. No decoding result SB2 of the codeword SA2 is transmitted.

The case where the code length of the codeword SA1 detected by use of the codeword length table Tc is zero corresponds to the case where the number of bits of the codeword SA1 is larger than the number of bits B1 which can be stored in the buffer circuit 10. In this case, the codeword SA1 is decoded by the method described in the first embodiment. Specifically, the detection circuit 20 detects the number of bits Ra of the prefix portion of the codeword SA1. Next, an extraction circuit 30 extracts the codeword Rb of the suffix portion. Then, a first decoding circuit 40 acquires the decoding result SBa by use of the expression (1) on the basis of the number of bits Ra of the prefix portion and the codeword Rb of the suffix portion. The decoding system shown in FIG. 8 transmits the decoding result SBa as the decoding result SB1 of the codeword SA1. No decoding result SB2 of the codeword SA2 is transmitted.

If a setting to decode one codeword is chosen, the decoding system shown in FIG. 8 decodes only the codeword SA1 stored in the buffer circuit 10, as in the method described in the second embodiment.

The system for decoding a variable-length codeword according to the third embodiment of the present invention performs decoding by use of the decoding table Tb for looking up the decoding result of the first codeword stored in the buffer circuit 10, and the second codeword decoding table Td for looking up the decoding result of the second codeword stored in the buffer circuit 10. Accordingly, when a plurality of codewords are stored in the buffer circuit 10, decoding two codewords can be performed in one cycle simultaneously. Therefore, with the system for decoding a variable-length codeword according to the third embodiment, it is possible to reduce the number of cycles required to decode a codeword. Otherwise, the third embodiment is substantially similar to the second embodiment, and a redundant description is omitted.

Other Embodiments

In the above description of the third embodiment, a decoding system for decoding two codewords stored in the buffer circuit 10 in the same cycle uses the decoding table Tb and the second codeword decoding table Td. It is also possible to provide a decoding system which includes a decoding circuit for decoding a third codeword stored in the buffer circuit 10, a decoding circuit for decoding a fourth codeword stored in the buffer circuit 10, and the like, so that the system decodes at least three codewords in the same cycle.

Various modifications will become possible for those skilled in the art after receiving the teachings of the present disclosure without departing from the scope thereof.

What is claimed is:

1. A system for decoding a variable-length codeword comprising:
   a buffer circuit configured to store at least a part of the variable-length codeword;
   a detection circuit configured to detect the number of bits of a prefix portion of the variable-length codeword by use of a detection table while updating the variable-length codeword;
   an extraction circuit configured to extract a codeword of a suffix portion of the variable-length codeword based on the number of bits of the prefix portion while updating the variable-length codeword; and
   a first decoding circuit configured to decode the variable-length codeword based on the number of bits of the prefix portion and the codeword of the suffix portion.

2. The system of claim 1, wherein the detection circuit comprises:
   a bit-number detection circuit configured to detect the number of zeros in a line from the top of the variable-length codeword stored in the buffer circuit; and
   a detection shifting circuit configured to update the buffer circuit by the number of zeros.

3. The system of claim 1, wherein the detection table is used to look up the number of zeros in a line from the top of the variable-length codeword stored in the buffer circuit.

4. The system of claim 1, further comprising: a detection register configured to store the number of bits of the prefix portion.

5. The system of claim 1, wherein the extraction circuit comprises an extraction shifting circuit configured to update the buffer circuit and sequentially extract the codeword of the suffix portion.

6. The system of claim 5, wherein the extraction shifting circuit updates the buffer circuit by the number of bits of the prefix portion.

7. The system of claim 1, further comprising: a second decoding circuit configured to decode the variable-length codeword by use of a decoding table when the entirety of the variable-length codeword is stored in the buffer circuit.

8. The system of claim 7, wherein the decoding table is used to look up the decoding result of the variable-length codeword stored in the buffer circuit.

9. The system of claim 7, further comprising: a codeword length table configured to look up the code length of the variable-length codeword stored in the buffer circuit.

10. The system of claim 1, further comprising: a third decoding circuit configured to decode a second variable-length codeword stored in the buffer circuit by use of a second codeword decoding table, when a plurality of variable-length codewords are stored in the buffer circuit.

11. The system of claim 10, wherein the second codeword decoding table is used to look up the decoding result of the variable-length codeword stored in the buffer circuit the second.

12. The system of claim 10, further comprising: a second codeword length table configured to look up the code length of the variable-length codeword stored in the buffer circuit the second.

13. A computer implemented method for decoding a variable-length codeword comprising:
   storing at least a part of the variable-length codeword in a buffer circuit;
   detecting the number of bits of a prefix portion of the variable-length codeword by use of a detection table while updating the variable-length codeword;
   extracting a codeword of a suffix portion of the variable-length codeword based on the number of bits of the prefix portion while updating the variable-length codeword; and
   decoding the variable-length codeword based on the number of bits of the prefix portion and the codeword of the suffix portion.

14. The method of claim 13, wherein detecting the number of bits of the prefix portion comprises:
   detecting the number of zeros in a line from the top of the variable-length codeword stored in the buffer circuit; and
   updating the buffer circuit by the number of 0.

15. The method of claim 13, wherein the detection table is used to look up the number of zeros in a line from the top of the variable-length codeword stored in the buffer circuit.

16. The method of claim 13, wherein extracting the codeword of the suffix portion comprises: updating the buffer circuit by the number of bits of the prefix portion and sequentially extracting the codeword of the suffix portion.

17. The method of claim 13, further comprising: decoding the variable-length codeword by use of a decoding table when the entirety of the variable-length codeword is stored in the buffer circuit.

18. The method of claim 17, wherein the decoding table is used to look up the decoding result of the variable-length codeword stored in the buffer circuit.

19. The method of claim 13, further comprising: decoding a second variable-length codeword stored in the buffer circuit, by use of a second codeword decoding table, when a plurality of variable-length codewords are stored in the buffer circuit.

20. The method of claim 19, wherein the second codeword decoding table is used to look up the decoding result of the variable-length codeword stored in the buffer circuit the second.

* * * * *